United States Patent [19]
Jones et al.

[11] Patent Number: 5,632,855
[45] Date of Patent: May 27, 1997

[54] THERMAL OXIDE ETCH TECHNIQUE

[75] Inventors: Stephen A. Jones; Shyam G. Garg, both of Austin, Tex.

[73] Assignee: Advanced Micro Devices, Sunnyvale, Calif.

[21] Appl. No.: 520,377

[22] Filed: Aug. 29, 1995

[51] Int. Cl.$^6$ .................................................. H01L 21/3065
[52] U.S. Cl. .................... 438/714; 156/345; 438/723
[58] Field of Search .................... 156/345, 643.1, 156/653.1

[56] References Cited

U.S. PATENT DOCUMENTS

| | | | |
|---|---|---|---|
| 5,169,487 | 12/1992 | Langley et al. | 156/653.1 |
| 5,398,712 | 3/1995 | Wang et al. | 137/15 |
| 5,445,709 | 8/1995 | Kojima et al. | 156/345 |

*Primary Examiner*—R. Bruce Breneman
*Assistant Examiner*—Anita Alanko
*Attorney, Agent, or Firm*—Kevin L. Daffer; Conley, Rose & Tayon

[57] ABSTRACT

A process is provided for etching thermally grown oxide. The process involves various steps and specific etch processing parameters used within a parallel electrode reactor. There are pre-stabilizing steps, followed by an etch step, which is then followed by post-stabilizing steps. The post-stabilizing steps may further include a particle removal or byproduct flush step in addition to the post-stabilizing steps. The process parameters are chosen to remove thermal oxide within contact regions at a uniform rate. The resulting thermal oxide is substantially uniform with less than 3.0% variance in thickness across the contact regions and across like areas of the entire wafer surface. The unique combination of pre-stabilize, etch, post-stabilize steps and process parameters chosen for each step thereby provides an improved etch uniformity of thermal oxide films within fine-line areas.

17 Claims, 4 Drawing Sheets

THERMAL OXIDE ETCH TECHNIQUE

BACKGROUND OF THE INVENTION

1. Field Of the Invention

This invention relates to integrated circuit fabrication and more particularly to integrated circuit processing parameters and step sequences which demonstrates substantially uniform removal of a silicon dioxide layer overlying single crystal silicon or polycrystalline silicon.

2. Description of the Relevant Art

The process of forming an oxide ($SiO_2$) upon a silicon-based material is often termed oxidation. While there are numerous ways in which to form an oxide, thermal oxide growth or "thermal oxidation" remains the most viable. Thermal oxidation involves subjecting the silicon-based material to an oxygen ambient, either dry oxygen or moist oxygen ($H_2O$-based oxygen). As the oxide grows, it consumes a portion of the silicon-based material, wherein the silicon-based material is either single crystal silicon or polycrystalline silicon.

Thermal oxide serves numerous purposes, two of which are to passivate the silicon-based surface and mask against ion implantation and diffusion therethrough. Openings within thermal oxide allow passage of dopants. Conversely, areas having thermal oxide substantially prevent (mask) dopant passage. The presence of thermal oxide prevents (passivates against) formation of certain types of thin films upon the oxide while allowing those types of films to form in areas void of oxide.

Exemplary applications of a thermal oxide include, for example, oxide formed on a sidewall of polysilicon to mask against placement of heavy dopants in the perimeter of the channel region. Thermally grown sidewall spacers are used predominantly in the well-known lightly doped drain (LDD) process. Removal of oxide in the source and drain while retaining the sidewall spacer not only allows placement of heavy dopants spaced from the channel within the underlying silicon substrate, but also allows subsequent formation of silicide in those areas void of oxide. Presence of sufficiently thick oxide elsewhere on the topographical substrate masks against silicide formation by preventing interaction of the refractory metal to the underlying silicon.

Proper placement of a sidewall spacer in the LDD process helps minimize short channel effects and hot carrier injection problems. Moreover, accurate and uniform removal of oxide adjacent the sidewall spacer, from the source and drain regions, allows high conductivity silicide growth in the metallization contact areas. If excessive oxide is allowed to remain in the contact areas, that oxide would prevent sufficient silicide formation in the localized areas. Further, the presence of unacceptable thickened areas of oxide could negatively trap charge at the contact. The trapped charge could deleteriously effect the resulting contact conductivity. Trapped charge often results from mobile ions introduced into the oxide as it is grown. The mobile ions arise from, for example, the thermal furnace, oxidizing ambient, wafer handling equipment, etc. Further, defects within the oxide, such as broken bonds, can further introduce traps within the oxide. Traps resulting from impurities or bond irregularities in the oxide are part and parcel of normal oxide growth, however, these deficiencies will be removed if the oxide is adequately and uniformly removed across the entire contact area.

Non-uniform removal of oxide in contact areas can therefore result in localized regions of thickened oxide existing across the contact area. Those localized regions can lead to a "thinning" of silicide and the charge trapping problems associated therewith.

An early technique used to remove oxide from source and drain contact regions involves wet etch removal. The liquid etchant used for wet etching of oxide demonstrates high selectivity to both substrate and the masking layer (i.e., high etch rate to oxide as opposed to the underlying silicon-based material and the overlying photoresist). Wet etching, however, is typically isotropic allowing significant undercutting into the gate oxides and field oxides adjacent the source and drain contact areas. Since many devices are formed with less than, for example, 2.0 µm critical dimension, oxide film less than 1.0 µm in thickness cannot be removed while retaining those critical dimensions. An alternative pattern transfer process is therefore needed. The alternative pattern transfer process must be significantly anisotropic, using a dry etch or plasma etch technique.

Dry etching is capable of reproducing a feature of a mask upon a device topography with high fidelity. That is, the anisotropic dry etch process allows pattern transfer of critical dimensions of less than, for example, 1.0 µm. While dry etching is more attuned to modern VLSI device fabrication, to be a fully useful process, dry etching must be highly selective against etching the silicon-based material under the oxide being etched. The dry etching process must also be uniformly applied across each contact area as well as across the entire wafer. Still further, dry etching must cause minimum damage to the underlying silicon-based material.

To enhance dry etch selectivity and uniformity, many researchers have experimented with different types of gasses and/or etching equipment. Generally speaking, there are three types of dry etching devices: (i) ion beam etching, (ii) ion-assisted etching (often termed reactive ion etching or "RIE"), and (iii) chemical etching or plasma etching. The first two etching techniques are often termed "directional" etching. That is, ion beams are directed at an angle preferably perpendicular to the upper surface of the wafer. Ion beam etching involves sputtering the upper wafer topological surface using a physical momentum transfer technique. While ion beam etching is substantially anisotropic, selectivity problems often arise. Plasma etching is more selective than ion beam etching, and is generally quite fast; however, plasma etching remains substantially isotropic, and is therefore less suitable for use in fabricating modern day VLSI devices. A few of the advantages of ion-assisted etching is that it is substantially anisotropic and is more selective than ion beam etching. Accordingly, ion-assisted etching or RIE etching remains a more optimal alternative, and one which is gaining momentum in modern day VLSI production.

Ion-assisted etching can be carried out using many types of commercial dry-etch systems. One of the more popular dry-etch systems, which achieves fine-line pattern transfer and profile retention, is one that is configured as a parallel-electrode reaction chamber. Power placed upon a pair of electrodes spaced from each other creates a potential difference within that space (or "gap") between the electrodes. The electric field potential causes the formation of ions sent from the plasma toward one of the electrodes. A silicon-based substrate with exposed thermal oxide placed within that gap thereby allows fine-line anisotropic etch of the oxide by the combination of a reactive chemical ambient as well as ions directed onto the oxide. End point detectors are integrated with the reactor to measure when the etch cycle is complete. End point detection employing laser interferometry, optical emission spectroscopy and mask spectroscopy are but a few well-known end point detection techniques.

While dry etching can be used to remove various types of thin films, such as silicon nitride, polysilicon, refractory metal, and organic films, it is the removal of oxides ($SiO_2$) which forms the emphasis herein. Specifically, dry etch removal of thermally grown oxide, in a uniform fashion across contact areas is of prime importance in forming a highly conductive source/drain contact. Dry etch techniques which can uniformly remove thermally grown oxide in small areas such as contact areas would thereby constitute a substantial improvement over conventional oxide removal techniques.

Dry etch removal of a thermally grown oxide is dependent upon several process parameters. The effectiveness of etch removal is based not only upon the nature of the oxide being removed and the temperature of that oxide, but also upon the operating parameters of the dry etch reactor (i.e., the parallel electrode reactor). In the latter instance, careful control of the reactant gas flow, pumping pressure and excitation power as well as frequency of the reactor RF power must be maintained in order to optimally achieve uniform removal of small area thermal oxide films. If any of the aforesaid parameters are skewed from an optimal target setting, the result could be a less than desirable contact conductivity. For example, if the excitation power/frequency of the parallel electrodes is not optimally chosen, then removal of oxide within the contact regions could be far less than uniform. Further, not only must a proper mixture of gas species be chosen to remove oxide, but those gasses must be mixed and introduced into a properly pressurized chamber in order to ensure correct contact and intermingling across the wafer peaks and valleys (i.e., across the wafer topological elevation).

It is thereby desirable that the process parameters within a parallel electrode reactor be optimally chosen to remove thermally grown oxides in fine-line areas, such as source/drain areas. It is also desirable that thermal oxide be uniformly removed across the entire source/drain area as well as across the entire wafer. The thermal oxide must be removed at a uniform rate across certain polysilicon gate regions. Regardless of the underlying silicon-based material (either single crystal silicon or polycrystalline silicon) chosen, the processing parameters must be selected such that oxide is removed, either completely or partially above a silicon substrate or polysilicon gate without affecting the underlying silicon substrate or polysilicon. The parameters for dry etch removal of oxide must therefore be selected to cause minimal damage to the underlying film or substrate, and must be highly selective against etching the underlying material.

SUMMARY OF THE INVENTION

The problems outlined above are in large part solved by choosing dry etch processing parameters which uniformly remove, either in part or in whole, thermally grown oxides from the source/drain contact regions as well as select gate polysilicon gate regions. The process parameters are chosen to be highly selective against etching the underlying silicon-based material and serve also to cause minimal damage to the underlying material during the etch step. Through empirical data obtained by actual tests and experimentation, the process parameters are hereby chosen to achieve less than 3.0% variance after etch of the resulting oxide thickness. The variance in thickness uniformity is measured across select contact areas of a wafer as well as from one contact area to another.

To verify the results, thickness measurements were performed across numerous wafers and at select points across each wafer. A standard deviation of less than 5.0% was achieved across each wafer and from wafer-to-wafer. By slowing the etch rate to less than 800 Angstroms for each 30 second etch period, the present dry etch technique achieves greater uniformity of the resulting oxide film, partially at the expense of slower throughput. In areas where oxide removal is critical, however, it has been determined that lowering throughput is acceptable if contact conductivity can be enhanced.

Broadly speaking, the present invention contemplates a method for removing thermally grown oxide. The method includes the steps of providing a silicon-based material having thermally grown oxide formed thereon. The oxide-coated silicon-based material is placed in a gap between a pair of electrodes arranged within a parallel electrode reactor. An ambient gas mixture of Ar, $CF_4$ and $CHF_3$ is inserted into the reactor and pressurized to less than 300 mTorr while maintaining the gap to less than 1.00 cm. One of the pair of electrodes then receives approximately 250 watts, while reactor pressure and electrode gap are maintained. Using 250 watts excitation energy at a standard 400 KHz RF frequency, and by using specific ambient pressure and gap distance, the present process parameters achieve the desired uniform removal of thermal oxide from fine-line areas, such as the source/drain contact regions. Any process parameters chosen outside the present range will produce a less than optimal result.

It has been further determined that usage of a flow rate of Ar, $CF_4$ and $CHF_3$ across a thermal oxide of 400 sccm, 20 sccm and 10 sccm, respectively, further enhances the uniform removal of thermal oxide. Pressurizing the ambient gas mixture and applying power to the parallel electrodes occur in two separate steps, after which etch byproducts are expelled from the reactor using inert carrier gasses, such as Ar and/or He.

BRIEF DESCRIPTION OF THE DRAWINGS

Other objects and advantages of the invention will become apparent upon reading the following detailed description and upon reference to the accompanying drawings in which.

Figure 1:
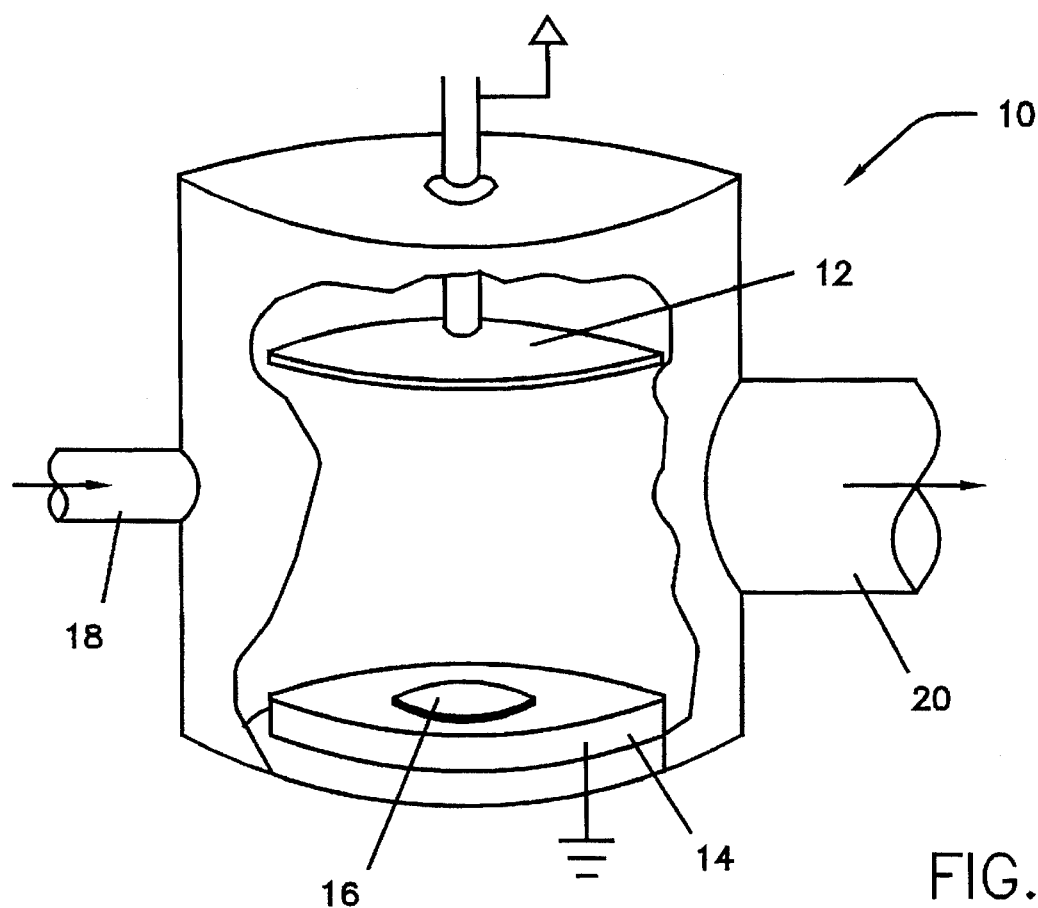
FIG. 1 is a isometric view in partial breakaway of a parallel electrode reactor configured to etch thermal oxide in accordance with the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 is an isometric view of an exemplary parallel electrode reactor 10 having RF power applied to an upper electrode 12 and ground voltage applied to lower electrode 14. Application of power can be reversed depending upon the application and desired outcome. Plasma etch merely requires there exist a potential across the electrodes sufficient to perform oxide removal. Therefore, any power coupling/configuration necessary to achieve the desired potential falls within the scope of the present reactor 10 design. A wafer 16 is insertable into reactor 10 and upon lower electrode 14. Wafer 16 includes an upper topological surface upon which a plurality of thin films, or layers, are formed. The upper surface is exposed to a plasma reaction within reactor 10, between electrodes 12 and 14. Reaction occurs by forwarding a mixture of gas into port 18 before or during times in which power is applied between electrodes 12 and 14. After the reaction is completed, as determined by various end point detection techniques, power is terminated and gas is expelled from port 20.

The reaction between electrodes 12 and 14 is highly dependent upon the process parameters used in performing that reaction. Namely, reaction is dependent upon several parameters, some of which are the excitation power supplied to electrode 12, vacuum pressure within the reactor chamber, the gas mixture and flow rate across wafer 16, and the gap or space between electrodes 12 and 14. These parameters, and the timed sequence in which the parameters are applied are optimally chosen to enhance uniform etch of thermally grown oxide in geographically small areas, such as the source/drain contact regions.

Referring now to FIGS. 2–5, cross-sectional views of semiconductor wafer processing steps are shown. The processing steps, initially illustrated in FIG. 2, begin as a partial cross-sectional view of a wafer 16 having a single crystal silicon substrate 22. Substrate 22 includes one or more opposite impurity type tubs or wells 24 formed therein. For example, substrate 22 can be a p-type substrate, and well 24 can be a n-type well formed within localized regions across the upper surface of substrate 22. Field oxide 26 is formed by thermal oxidation of the silicon bulk material using, for example, local oxidation of silicon (LOCOS) process.

Figure 2:
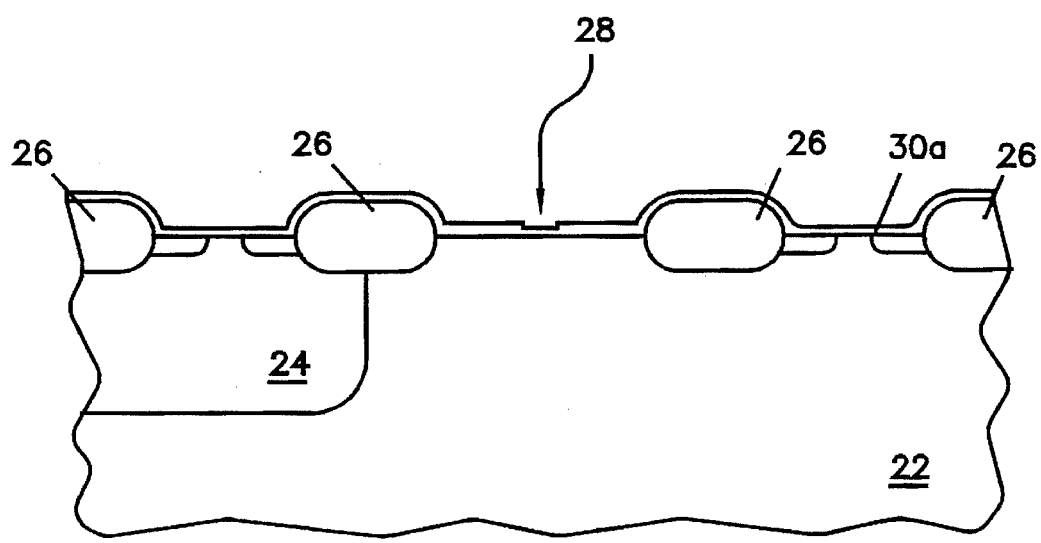
FIGS. 2–5 are cross-sectional views of a partial semiconductor wafer having various thin films, including oxide films, formed and thereafter selectively removed from source/drain contact regions in accordance with the present invention.

In non-volatile memory applications, numerous regions between field oxides 26 require formation of a tunnel oxide. An exemplary tunnel oxide 28 is shown in FIG. 2. Tunnel oxide 28 can be formed by growing a gate oxide 30a and selectively etching back the gate oxide in regions where the tunnel oxide 28 is to be formed. Thus, a gate oxide is thermally grown in active regions between field oxides 22 and, thereafter, tunnel oxides are formed by a localized etch back technique. There may be numerous other ways in which to form a tunnel oxide; however, merely for purpose of brevity, only one process is shown. Whatever process is chosen, it is understood that tunnel oxide 28 is substantially thinner than gate oxide 30a.

Figure 3:
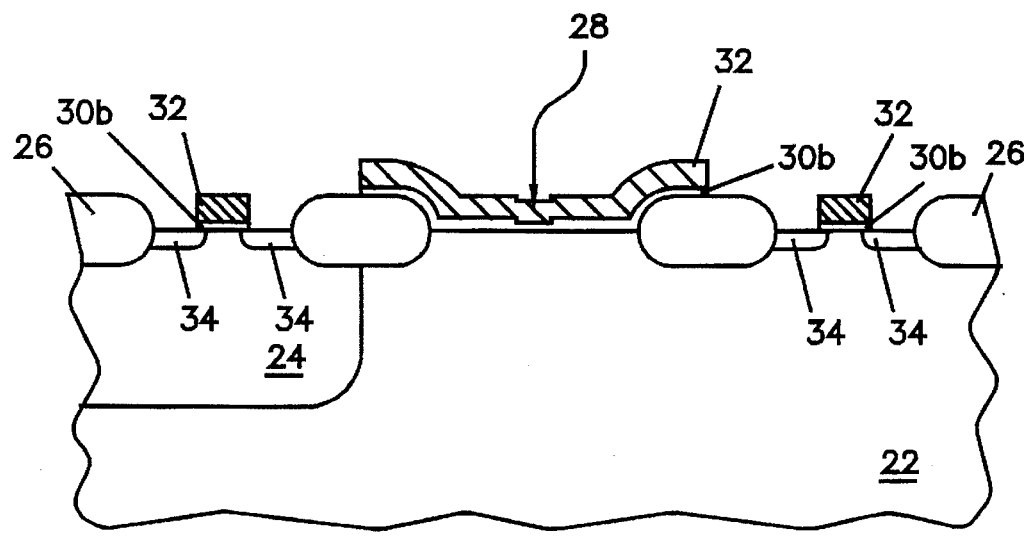

FIG. 3 illustrates a processing step subsequent to that shown in FIG. 2, wherein a layer of polysilicon is deposited across the entire upper surface of gate oxide 30a as well as tunnel oxide 28. The layer of polysilicon and underlying gate oxide is thereafter selectively removed to form polysilicon gate conductors 32 and patterned, underlying gate oxide 30b. Using the self-align process, field oxides 26 as well as gate conductors 32 and underlying pattern gate conductors 30b mask implant of ions forwarded onto the upper wafer surface. A result of the self-align process is the formation of lightly doped regions of opposite polarity then the underlying substrate 22 (or well 24). The light doped regions are denoted in FIG. 3 as reference numeral 34.

Figure 4:
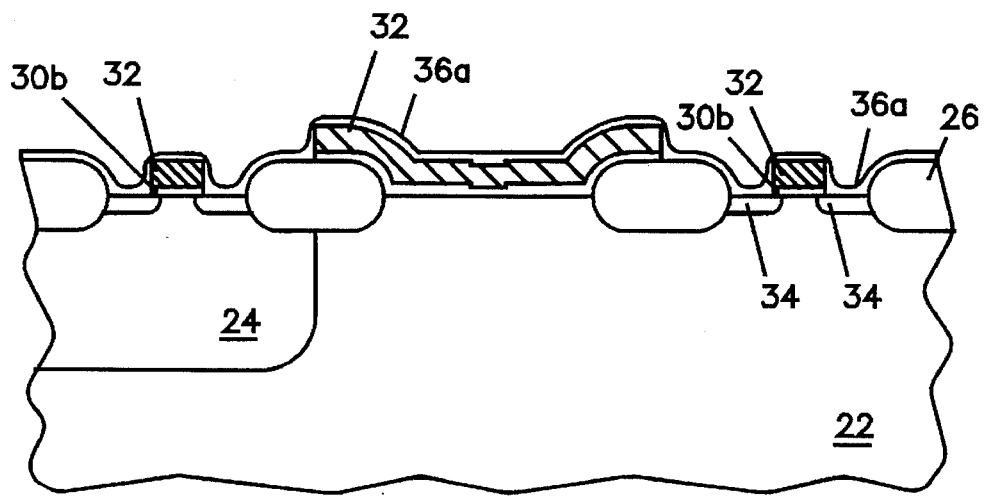

FIG. 4 illustrates a processing step subsequent to that of FIG. 3. FIG. 4 indicates an oxidation step in which thermal oxide 36a is grown across the entire wafer surface and specifically in areas where an underlying silicon-based material exists. Accordingly, thermal oxide 36a is grown upon and into substrate 22 and 24 as well polysilicon gate conductors 32.

Figure 5:
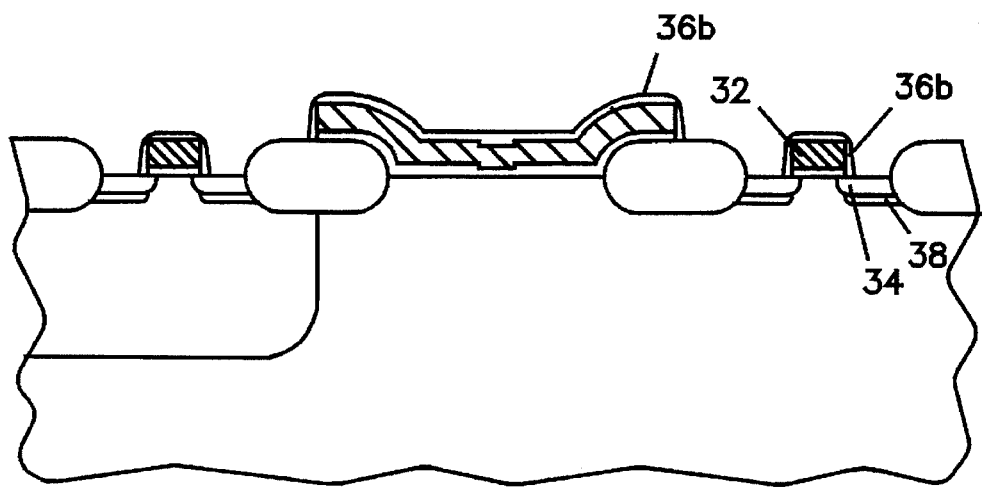

Referring now to FIG. 5, thermal oxide 36a is patterned in a subsequent processing step to that of FIG. 4. Patterning of thermal oxide 36a produces a gate protect oxide 36b. Formation of a patterned gate protect oxide 36b results from photolithography techniques, whereby photoresist is selectively removed to expose thermal oxide 36a in all regions except for polysilicon gate conductors 32 and areas immediately adjacent conductors 32. Exposing portions of thermal oxide 36a allow dry etch removal of oxide in those regions of interest. It is important that various dry etch process parameters be carefully followed to achieve uniform removal of thermal oxide 36a in regions where gate conductors 32 do not reside and, more specifically, in source/drain regions of fine-line geometries.

FIG. 5 indicates gate protect oxide 36b resulting from select removal of oxide 36a. Gate protect oxide 36b extends as a sidewall spacer on opposing lateral surfaces of gate conductor 32. The sidewall spacers extend outward from the lateral edges of gate conductor 32 a defined distance. The purpose in having sidewall spacers is to allow, according to the self-aligned process, subsequent implant of heavy doped impurities into substrate 22 or 24. The impurities form a heavy doped region 38 which is spaced further away from the channel region than lightly doped region 34.

It is important to uniformly remove oxide 36a from source/drain regions to allow uniform introduction of dopants within region 38. It is therefore necessary to remove those oxide areas so that localized regions of silicide thinning do not occur. A process step subsequent to that of FIG. 5 is indicative of silicide formation at the upper surface of source/drain contact regions (regions 34 and 38). To achieve optimal silicide result, a substantially uniform layer of extremely thin (in some instances non-existent) oxide remain within the source/drain contacts. A refractory metal is deposited into those contacts having thin oxide or no oxide, and heat is thereafter applied to allow intermingling of silicon and metal atoms at the juncture. The process of silicide formation is fairly well documented, and provides conductivity enhancement, if optimally performed, at the contact points. If localized areas of relatively thick oxide remain in certain areas across one or more contacts, then the locally thick oxide will impede silicidation and cause localized silicide thinning in those areas. Retention of spaced areas thicker oxide (i.e., non-uniform oxide) across a contact can, simply due to its existence, deleteriously trap carriers (holes or electrons) or other mobile ions sent through the contact region as a result of circuit operation.

Formation of lightly doped regions 34 and, thereafter, formation of sidewall spacer and heavily doped regions 38 involve well known techniques. However, a uniform removal of thermal oxide 36a above regions 38 to allow contact conductivity enhancement is not well known with respect to the various process parameters for achieving that result.

Figure 6:
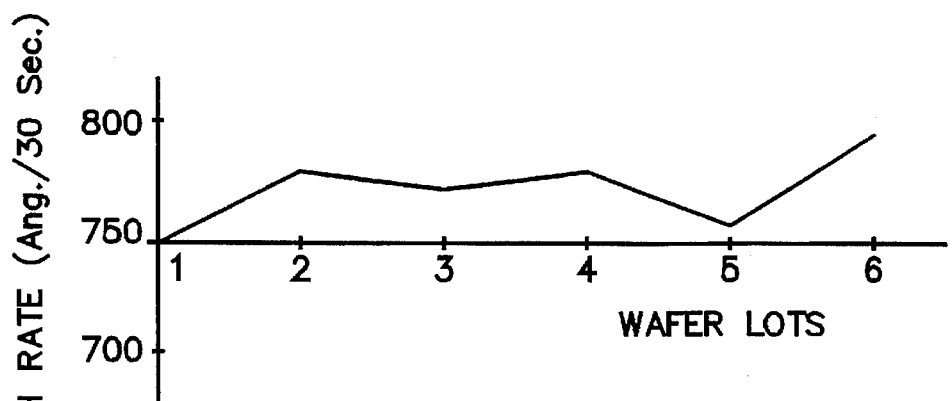
FIG. 6 is a graph of average etch rate taken from oxide film locations across wafers within six different wafer lots.
Figure 7:
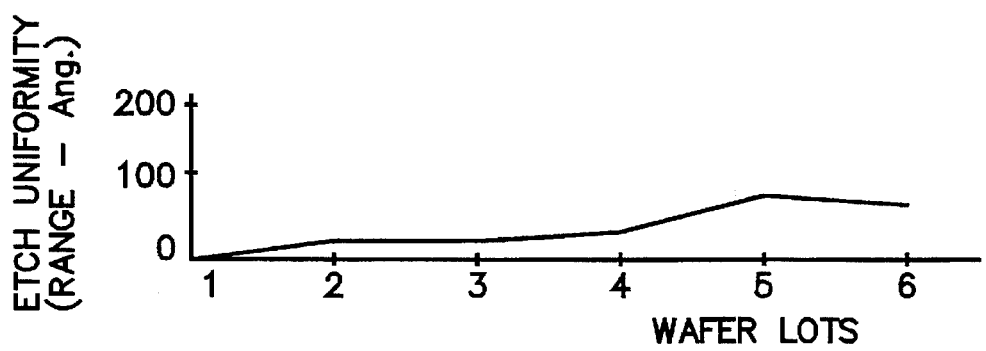
FIG. 7 is a graph of etch uniformity taken from oxide films across wafers within six different wafer lots.

Turning now to FIG. 6 and 7, actual experimentation was performed on six dissimilar wafer lots indicated on the horizontal axis as wafer lot nos. 1 through 6. Wafers within each lot were tested for etch rate and resulting etch uniformity across a plurality of test locations at the resulting oxide surface. An average reading was taken for each wafer, and that wafer was averaged for other wafers within a lot. The first wafer lot indicated an average etch rate of approximately 750 angstroms for each 30 second interval. The range of etch uniformity deviation for the first wafer lot was immeasurable, and therefore placed at approximately 0.0 (as shown in FIG. 7). The second wafer lot indicates a higher etch rate with corresponding higher deviation in resulting etch uniformity. The same applies to the other wafer lots to varying degrees, indicating a more optimal first wafer lot result.

Figure 8:
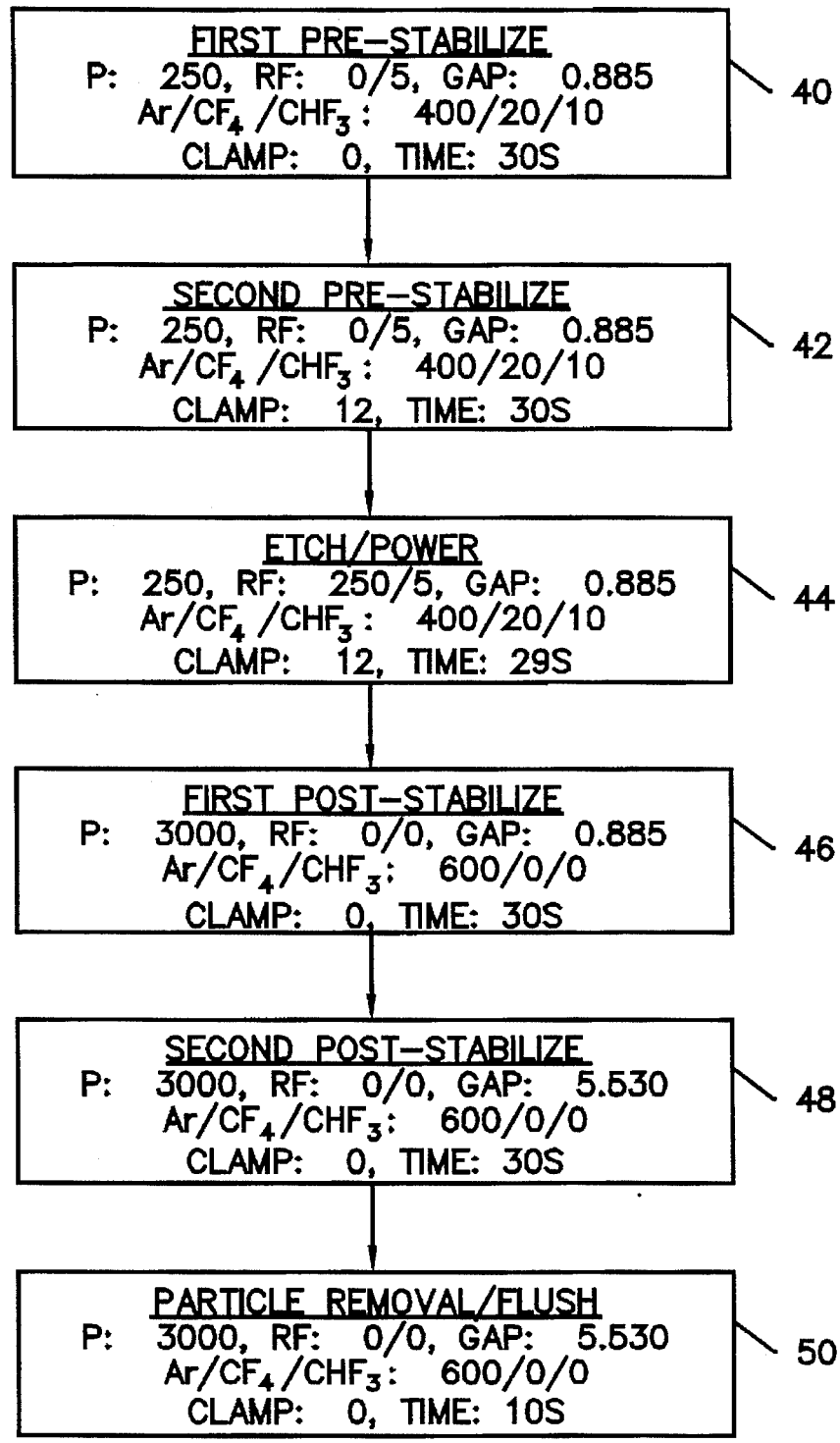
FIG. 8 is a flow diagram of various steps and process parameters found to optimally perform the oxide etch of the present invention.

Each wafer lot was processed similarly with skews attributable to normal process fluctuations. The process parameters used in producing wafer lots one through six are further described in FIG. 8. FIG. 8 describes a production process setting of various etch parameters and step sequences for optimally removing thermally grown oxide. Optimal process parameters and sequences were thereby confirmed from the experimental results upon actual wafers, as shown in FIGS. 6 and 7.

FIG. 8 illustrates a process flow diagram of various processing steps used in removing thermal oxide 36a in select regions taken from the optimal process recipe formulated from the experimental results set forth in FIGS. 6 and 7. Select removal of oxide 36a from contact regions 34 and 38 begins by placing thermal oxide-coated wafer 16 through a photoresist spin, develop and etch process. Removal of select photoresist regions presents exposed areas of thermal oxide. Wafer 16 having exposed regions of thermal oxide is placed within a parallel-plate reactor 10, shown in FIG. 1. According to a first pre-stabilized step 40, wafer 16 is thereafter exposed within reactor 10 to a pressure of 250 mTorr and in Ar, $CF_4$ and $CHF_3$ flow rate of 400 sccm, 20 sccm and 10 sccm, respectively. The gas mixture of Ar, $CF_4$ and $CHF_3$ is maintained at the above-stated flow rates across wafer 16 via inlet port 18 (shown in FIG. 1). The first pre-stabilized step 40 retains gap between electrodes 12 and 14 at 0.885 cm. with no excitation energy applied to the electrodes.

First pre-stabilized step 40 is preferably performed for approximately 30 seconds to allow a steady state flow rate to occur at a stabilize reactor pressure. After gas mixture and flow rate are stabilized within a constant pressure reactor, a second pre-stabilized step 42 is initiated. Step 42 assumes the same parameters as step 40, with the only change being the initiation of pressurized helium ingress into the chamber. Entry of helium is referred to as the "clamp" parameter, wherein clamp refers to the amount of pressure associated with helium inserted into the chamber. Helium is inserted through lateral channels within the pedestal (or chuck) upper surface upon which the wafer is physically held. Helium thereby flows across the wafer backside surface during step 42 at a pressure of approximately 12.0 torr. A retainage force is associated with helium entry, wherein the retainage force secures the wafer to the pedestal while helium flows across the wafer backside surface. The wafer is retained against one electrode in readiness for subsequent steps.

Once the wafer has been clamped and steady state conditions achieved, wafer 16 is then conditioned for etch step 44. Etch step 44 is similar to previous step 42 except that power is now applied to upper electrode 12. Power has been chosen from experimental results at an optimal amount of 250 watts at the chosen gap distance, pressure and gas mixture flow rates shown in step 44 of FIG. 8. Denotation of "RF: 250/5" indicates application of 250 watts of power to an electrode having an inductive match setting at the "match box" of 5. A match box, its application and use, is a device well known to plasma etch equipment manufacturers and wafer fabrication engineers for minimizing reflected power at the plasma etch load. The etch/power activation step 44 is continued for approximately 29 seconds to allow stated removal of thermal oxide 36a from contact regions 34 and 38.

After thermal oxide 36a is selectively removed to a desired elevational level, power is removed from upper electrode 12, pressure is enhanced to 3,300 mTorr and $Ar/CF_4/CHF_3$ flow rate is changed to 600/0/0 sccm, as shown in the first post-stabilized step 46. Step 46 further indicates removal of retention force from the wafer clamp to allow purge of reactant byproducts from the reactor chamber using the inert species of argon (Ar). Enhanced pressure allows exhaust of those species through port 20 (shown in FIG. 1). A second post-stabilized step 48 is presented subsequent to step 46, wherein the spacing between electrodes 12 and 14 is extended from 0.885 to 5.530 cm. Movement of electrodes away from each other is necessary in step 48 to allow ingress of the operator into the gap area and removal of the wafer without damaging the bottom surface of upper electrode 12. Movement of electrodes away from each other is performed while pressure is enhanced and argon purge is performed for approximately 30 seconds, as shown in step 48. A further step 50 may be necessary to evacuate any additional particles within the reactor chamber caused either by contaminants from the inlet lines or reactor surfaces, or by electrode movement. Step 50 is provided to allow the extra purge of the system, if needed.

The various processing steps shown in FIG. 8 used for etching thermal oxide 36, and the process and parameters indicated in each of those steps achieves uniform resulting oxide thickness across the contact area or uniform removal of the entire oxide film from the contact areas. Uniformity in removal of the oxide is therefore an important aspect which allows uniform silicidation formation in those areas. The various process parameters in step sequence were obtained from actual experimental results performed on numerous wafer lots, some of which are shown in FIGS. 6 and 7.

It will be appreciated to those skilled in the art having the benefit of this disclosure that this invention is believed to be capable of applications with numerous types of integrated circuits embodied within and/or upon a semiconductor substrate. Furthermore, it is also understood that the form of the invention shown and described is to be taken merely as presently preferred examples of how dry etch removal of thermal oxide might be carried out in a parallel electrode reactor. Various modifications and changes may be made to the above process parameters without departing from the spirit and scope of the invention as set forth in the claims. It is intended that the following claims be interpreted to embrace all such modifications and changes and, accordingly, the specification and drawings are to be regarded in an illustrative rather than a restrictive sense.

What is claimed is:

1. A method for removing thermally grown oxide, comprising the steps of:

providing a silicon-based material having thermally grown oxide formed thereon;

placing the oxide-coated silicon-based material in a gap between a pair of electrodes arranged within a parallel electrode reactor;

pressurizing an ambient gas mixture of Ar, $CF_4$ and $CHF_3$ inserted into said reactor to a pressure less than 300 mTorr while maintaining said gap to less than 1.0 cm for a first time period, said first time period being a first pre-stabilizing step;

inserting helium across said silicon-based material to a pressure approximately 12.0 Torr for a second time period, said second time period being a second pre-stabilizing step;

applying approximately 250 watts to one of said electrodes for a third time period, while maintaining the parameters of said first and second pre-stabilizing steps, to remove said thermally grown oxide;

increasing the pressure within said reactor to approximately 3000 mTorr while terminating the flow rates of $CF_4$ and $CHF_3$ for a fourth time period, said fourth time period being a first post-stabilizing step;

increasing said gap while maintaining the parameters of said first post-stabilizing step for a fifth time period, said fifth time period being a second post-stabilizing step; and expelling additional etch products from said reactor while maintaining the parameters of said second post-stabilizing step for a sixth time period, said sixth time period being a particle-removal step.

2. The method as recited in claim 1, wherein said placing step comprises exposing said thermally grown oxide to the ambient gas mixture within said reactor.

3. The method as recited in claim 1, wherein said inserting helium step comprises increasing a helium pressure upon the substrate backside surface from 0 to 12.0 torr.

4. The method as recited in claim 1, wherein said first time period is approximately 30 seconds.

5. The method as recited in claim 1, wherein said pressurizing step comprises applying a flow rate of Ar, $CF_4$ and $CHF_3$ across said thermal oxide of 400 sccm, 20 sccm, and 10 sccm, respectively.

6. The method as recited in claim 1, wherein said increasing said gap comprises increasing the gap distance between said pair of electrodes to approximately 5.530 cm.

7. The method as recited in claim 1, wherein said silicon-based material comprises single crystal silicon.

8. The method as recited in claim 1, wherein said second time period is approximately 30 seconds.

9. The method as recited in claim 1, wherein said third time period is approximately 29 seconds.

10. The method as recited in claim 1, wherein said fourth and fifth time periods are each approximately 30 seconds.

11. The method as recited in claim 1, wherein said sixth time period is approximately 10 seconds.

12. A method for removing thermally grown oxide from a silicon-based material, comprising the steps of:

placing said oxide-coated silicon-based material in a gap between a pair of electrodes arranged within a parallel electrode reactor;

inserting gas mixture of Ar, $CF_4$ and $CHF_3$ at flow rates of 400 sccm, 20 sccm and 10 sccm, respectively, into said reactor pressurized to a pressure of 250 mTorr while maintaining said gap at 0.885 cm;

increasing helium pressure from 0 to 12 Torr upon the substrate of said silicon-based material's backside surface;

applying 250 watts to one of said electrodes while maintaining the pressure and gap of the previous steps to remove said thermally grown oxide with a uniformity measuring less than 2.5% deviation across said oxide-coated substrate;

increasing the pressure of said reactor to approximately 3000 mTorr;

increasing the Ar flow rate to approximately 600 sccm while terminating the flow rates of $CF_4$ and $CHF_3$; and increasing said gap to approximately 5.530 cm while maintaining the increased reactor pressure.

13. The method as recited in claim 12, wherein said inserting gas mixture and increasing helium pressure steps occur during two time periods of approximately 30 seconds each, the first time period being a first pre-stabilizing step and the second time period being a second pre-stabilizing step.

14. The method as recited in claim 12, wherein said silicon-based material comprises single crystal silicon.

15. The method as recited in claim 12, therein said applying step occurs during a time period of approximately 29 seconds.

16. The method as recited in claim 12, wherein said increasing the pressure and increasing the Ar flow rate steps occur during a time period of approximately 30 seconds, said time period being a first post-stabilizing step.

17. The method as recited in claim 12, wherein said increasing said gap step occurs during a time period of approximately 30 seconds, said time period being a second post-stabilizing step.

* * * * *

UNITED STATES PATENT AND TRADEMARK OFFICE
CERTIFICATE OF CORRECTION

PATENT NO. : 5,632,855

DATED : May 27, 1997

INVENTOR(S) : Stephen A. Jones and Shyam G. Garg

It is certified that error appears in the above-indentified patent and that said Letters Patent is hereby corrected as shown below:

Claim 15, col. 10, line 37, please replace the word "therein" with the word "wherein".

Signed and Sealed this

Twenty-eighth Day of October, 1997

Attest:

BRUCE LEHMAN

Attesting Officer

Commissioner of Patents and Trademarks